(12) United States Patent
Yamada et al.

(10) Patent No.: US 6,827,622 B2
(45) Date of Patent: *Dec. 7, 2004

(54) METHOD OF MANUFACTURING ELECTROLUMINESCENCE DISPLAY APPARATUS

(75) Inventors: Tsutomu Yamada, Gifu (JP); Ryuji Nishikawa, Gifu (JP); Susumu Oima, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/185,534

(22) Filed: Jun. 28, 2002

(65) Prior Publication Data

US 2003/0017259 A1 Jan. 23, 2003

(30) Foreign Application Priority Data

Jun. 29, 2001 (JP) ......................................... 2001-198927

(51) Int. Cl.⁷ ............................. H01J 9/00; C23C 16/00
(52) U.S. Cl. ........................... 445/24; 427/66; 430/313; 430/315; 118/720
(58) Field of Search ....................... 445/24, 25; 427/66; 430/313, 315, 319, 321; 118/716, 720, 721, 729; 313/498–512

(56) References Cited

U.S. PATENT DOCUMENTS

| | | | | |
|---|---|---|---|---|
| 4,143,297 A | * | 3/1979 | Fischer | 313/502 |
| 4,344,988 A | * | 8/1982 | Sono et al. | 427/255.5 |
| 4,372,248 A | * | 2/1983 | Martin | 118/720 |
| 4,469,719 A | * | 9/1984 | Martin | 427/255.5 |
| 4,492,180 A | * | 1/1985 | Martin | 118/704 |
| 4,915,057 A | * | 4/1990 | Boudreau et al. | 118/505 |
| 5,288,379 A | * | 2/1994 | Namiki et al. | 204/192.12 |
| 5,403,614 A | * | 4/1995 | Kawashima et al. | 427/66 |
| 5,817,366 A | * | 10/1998 | Arai et al. | 427/66 |
| 6,255,775 B1 | * | 7/2001 | Ikuko et al. | 313/506 |
| 6,328,807 B1 | * | 12/2001 | Boek et al. | 118/724 |
| 6,469,439 B2 | * | 10/2002 | Himeshima et al. | 313/506 |
| 6,475,287 B1 | * | 11/2002 | Clark | 118/721 |
| 6,517,996 B1 | * | 2/2003 | Chao et al. | 430/321 |
| 6,589,382 B2 | * | 7/2003 | Clark et al. | 156/304.3 |
| 2001/0003601 A1 | * | 6/2001 | Ueda et al. | 427/64 |
| 2001/0006827 A1 | * | 7/2001 | Yamazaki et al. | 438/30 |
| 2002/0076847 A1 | * | 6/2002 | Yamada et al. | 438/34 |
| 2002/0187265 A1 | * | 12/2002 | Mori et al. | 427/282 |
| 2003/0012981 A1 | * | 1/2003 | Yamada et al. | 428/690 |
| 2003/0150123 A1 | * | 8/2003 | Fan et al. | 33/542 |

OTHER PUBLICATIONS

Office Action for U.S. Appl. No. 10/183,149 dated Feb. 12, 2004.
Office Action for U.S. Appl. No. 10/183,251 dated Apr. 6, 2004.

* cited by examiner

*Primary Examiner*—Ashok Patel
*Assistant Examiner*—German Colón
(74) *Attorney, Agent, or Firm*—Cantor & Colburn LLP

(57) ABSTRACT

A glass substrate is placed within a vacuum chamber with the surface on which an emissive layer forming an electroluminescence element is to be formed by evaporation facing downward. A mask is disposed within the vacuum chamber. A material of the emissive layer is adhered to the glass substrate through an opening of the mask, to thereby form the emissive layer. When the glass substrate and the mask are aligned, at least three sides of the glass substrate are supported by side supporting members.

15 Claims, 12 Drawing Sheets

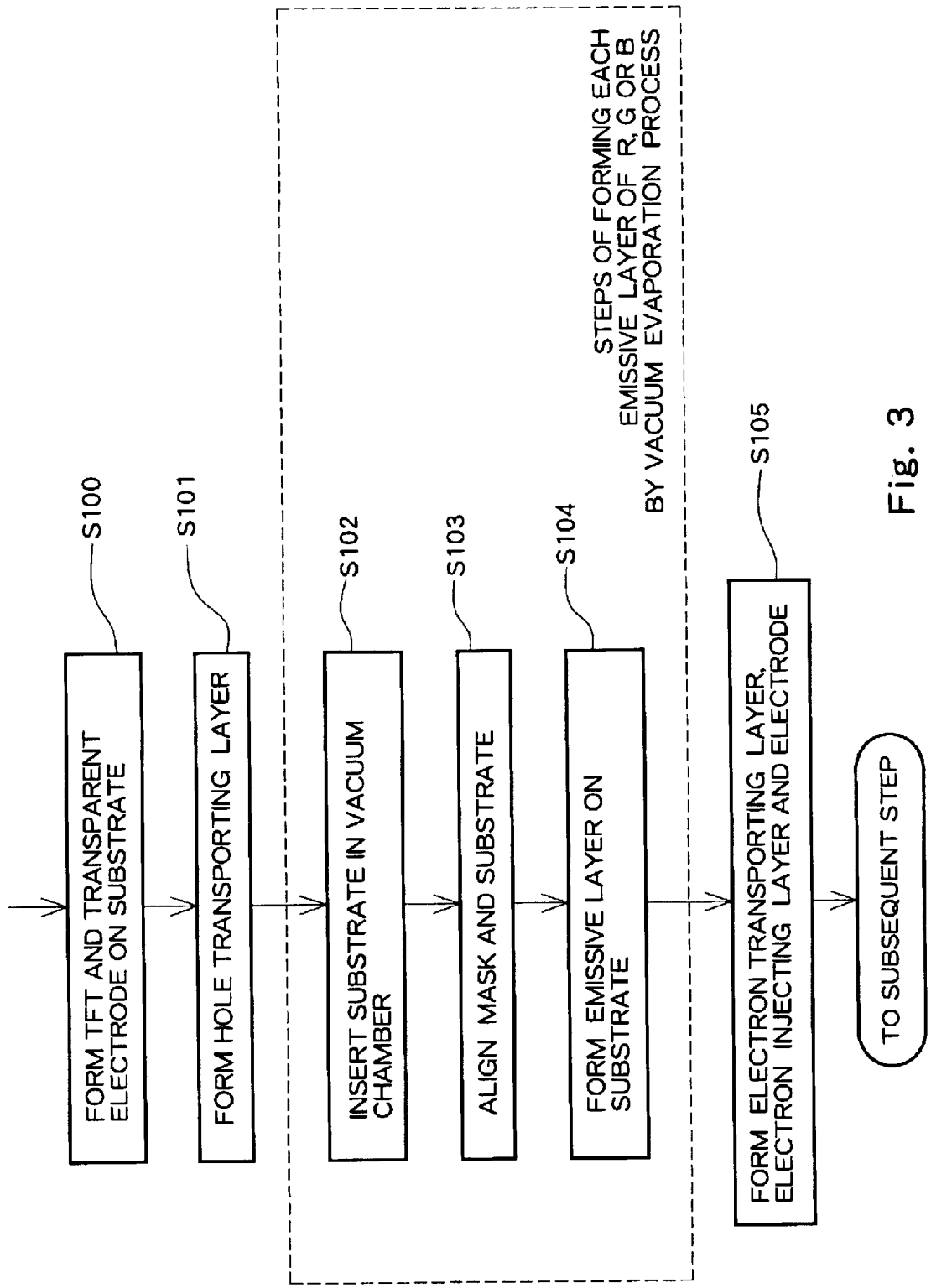

METHOD OF MANUFACTURING ELECTROLUMINESCENCE DISPLAY APPARATUS

BACKGROUND OF THE INVENTION

1. Field of the Invention

The present invention relates to a method of manufacturing an electroluminescence (EL) display apparatus, and more particularly to a method of manufacturing an EL display apparatus, in which an EL element is formed on a substrate surface using a mask.

2. Description of Related Art

In recent years, display apparatuses using an EL element have attracted great attention.

Such an EL element may be constituted, for example, by an anode formed by a transparent electrode made of ITO (Indium Tin Oxide) or the like, a hole transporting layer made of MTDATA (4,4',4"-tris(3-methylphenylphenylamino)triphenylamine) or TPD (N,N'-diphenyl-N,N'-di(3-methylphenyl)-1,1'-biphenyl-4,4'-diamine), an emissive layer made of $BeBq_2$ (bis(10-hydroxybenzo[h]quinolinato)beryllium) including quinacridone derivative or the like, an electron transporting layer made of $BeBq_2$ or the like, and an electrode (cathode) made of a magnesium indium alloy or the like, which are sequentially accumulated in a laminate structure. In such an EL element, holes injected from the anode and electrons introduced from the cathode are recombined in the emissive layer when a required voltage is applied between these electrodes, to thereby excite organic molecules forming the emissive layer to generate excitons. Through the process in which these excitons radiate until deactivation, the emissive element projects light which is directed externally from the transparent anode through the transparent insulating substrate, whereby desired emission is obtained.

When a display apparatus using such an EL element, i.e. an EL display apparatus, is constituted as a color image display apparatus, the EL display apparatus has a structure of a dot matrix display apparatus in which EL elements each emitting light corresponding to one of three colors, for example, red (R), green (G), and blue (B) are arranged in a matrix. In order to drive these EL elements arranged in a dot matrix pattern, a passive matrix method or an active matrix method can be employed.

In the passive matrix method, the EL elements arranged in a matrix pattern on the display panel to form respective pixels are directly driven externally in synchronization with a scanning signal. In this case, the display region in the display apparatus is constituted only by the EL elements.

In the active matrix method, on the other hand, a pixel driving element (an active element) is provided for each of the EL elements arranged in a matrix to form the respective pixels. The pixel driving element acts as a switch element which switches between on and off states in accordance with a scanning signal. The EL element is driven in such a manner that a data signal (a display signal or a video signal) is transmitted to the anode of the EL element through the pixel driving element which is in the on state, and predetermined current corresponding to the data signal flows between the anode and cathode of the EL element.

For the formation of EL elements used in such a display apparatus, a vacuum evaporation process is often employed. The formation of an EL element using the vacuum evaporation process basically includes the following two steps:

(1) within a vacuum chamber, covering, with a mask, portions of a substrate other than portions where EL elements are to be formed and placing the substrate such that the masked surface faces in the vertically downward direction; and (2) heating a material for forming the EL element, including a material of an emissive layer or the like, to evaporate the material from under the substrate, thereby depositing the material on the substrate surface and forming the EL element.

In order to form the EL element on the substrate surface in the above-described manner, it is necessary, especially for the formation of the emissive layer, to very accurately align the substrate and the mask. However, if at the time of alignment the substrate is supported in such manner that the EL element forming surface of the substrate constitutes a lower surface which faces downward, it is not possible to dispose this lower surface in direct contact with the mask because most of the lower surface forms the display panel region on which the EL element or the like is to be formed. In other words, it is necessary to support the end portions of the substrate, regions other than the display panel region with an appropriate support hand or the like. When the end portions of the substrate are supported, however, flexure is likely to be generated in the center portion of the substrate. As a result, when the substrate is moved toward the mask side, the center portion of the substrate first comes into contact with the mask. If, under this state, the substrate and the mask are moved relative to each other so as to make alignment, there is a possibility that the film surface of the substrate is damaged, and accurate alignment cannot be obtained.

On the other hand, from the standpoint of the accuracy of alignment and of film deposition, it is desirable to place the substrate and the mask as close to each other as possible, which further exacerbates the above problem.

Further, the above-described problem that flexure in the substrate makes alignment difficult occurs not only with the vacuum evaporation process but also when the EL element is formed by other methods. Therefore, this problem is generally in common in various manufacturing methods as long as accurate alignment is required between the substrate and the mask.

SUMMARY OF THE INVENTION

The present invention was conceived in view of the above described problems of the related art and an object of the present invention is to enable more accurate alignment between a mask and a substrate when forming an electroluminescence element using a mask.

In accordance with one aspect of the present invention, there is provided a method of manufacturing an electroluminescence display apparatus, in which, after alignment of a substrate and a mask disposed below the substrate, a material of an electroluminescence element is adhered to the substrate through an opening of the mask to form an electroluminescence element layer, and at least three sides of the substrate are supported by side supporting members at the time of the alignment between the substrate and the mask.

By performing the alignment between the substrate and the mask while the substrate is being supported by the side supporting members as described above, it is possible to inhibit flexure from being generated in the substrate and thereby increase the accuracy of the alignment. It is also possible to prevent the substrate from being bent and contacting the mask or the like disposed below, causing the substrate and the mask to be damaged.

In accordance with another aspect of the present invention, it is preferable that, of the side supporting members, a pair of the side supporting members which support opposing sides of the substrate are symmetrical with respect to each other, at least with respect to a contact and support portion of the side supporting member which contacts and supports the substrate.

When the side supporting members have such a symmetrical feature, in addition to a decrease of the flexure generated in the substrate, it is also possible to support the substrate easily in an even manner. Accordingly, even when the substrate is bent to some extent, it is possible to prevent the substrate being significantly bent in a local region. Thus, the forming conditions of the electroluminescence element layer will not vary, which further prevents significant variation of the display quality within the display region.

In accordance with still another aspect of the present invention, a side portion of a surface of the substrate opposing the mask is disposed on the contact and support portion of the side supporting member. By supporting the substrate in this manner, the substrate can be supported reliably with a simple structure.

In accordance with a further aspect of the present invention, the mask is fixed and positioned with respect to mask frames which are arranged at intervals each being larger than the length of a portion of the substrate in the side direction which is supported by the contact and support portion of the side supporting member, and, after the mask which has been positioned and the substrate which is supported by the side supporting members are aligned with each other, the side supporting members are withdrawn or removed from positions on the substrate where the side supporting members support the substrate, through the intervals of the mask frames.

The mask frames on which the mask is positioned thus include the intervals which do not interfere with the motion of the side supporting members, so that the side supporting members can be withdrawn quickly without unintentionally touching the substrate and the mask. This makes it possible to reliably accommodate a need, if any, for removing the side supporting members at the time of the formation of the electroluminescence element layer.

In accordance with another aspect of the present invention, the mask is fixed and positioned with respect to a mask frame, after the mask which has been positioned and the substrate which is supported by the side supporting members are aligned with each other, the side supporting members are withdrawn, and, subsequently, an electroluminescence element layer is formed on a lower surface of the substrate while the substrate is being supported on at least one of the mask and the mask frame.

Here, in accordance with still another aspect of the present invention, the mask frame may be disposed on a holding plate, and the mask, the mask frame, or the holding plate may comprise pins for supporting the substrate thereon.

When an electroluminescnece element layer is formed after the side supporting members are withdrawn, by supporting the substrate by the mask, the mask frame or the like, it is possible to prevent the flexure generated in the substrate at the time of formation of this element layer, which leads to an increase of the accuracy of formation of the element layer and also to an improvement of the quality of a display apparatus. Further, supporting of the substrate by means of the mask, the mask frame, or the holding plate can be achieved using a simple structure such as the above-described pins.

In accordance with another aspect of the present invention, the mask is fixed and positioned with respect to a mask frame, and the mask which has been positioned and the substrate are aligned with each other, with the substrate being supported by the side supporting members and a plurality of pins provided on the mask or on the mask frame.

In accordance with still another aspect of the present invention, the alignment between the mask and the substrate is performed while the substrate is being supported by the side supporting members and an electrostatic adsorption member for adsorbing an upper surface of the substrate by means of electrostatic force.

As described above, in addition to the side supporting members, a further supporting mechanism is employed during alignment, so that the flexure in the substrate generated at the time of alignment can be still more reliably prevented.

In accordance with another aspect of the present invention, at least the alignment between the substrate and the mask may be performed within a vacuum chamber. Further, the vacuum chamber may be an evaporation chamber for the electroluminescence element layer, for example.

As described above, even when the alignment of the substrate is carried out within a vacuum chamber or the like, it is possible to reliably support the substrate using a combination of the side supporting members and the pins or an electrostatic adsorption member or the like.

BRIEF DESCRIPTION OF THE DRAWINGS

These and other objects of the invention will be explained in the description below, in connection with the accompanying drawings, in which:

FIG. 3 is a flowchart showing manufacturing procedures in a method of manufacturing an EL display apparatus according to a first embodiment of the present invention;

DETAILED DESCRIPTION OF THE PREFERRED EMBODIMENTS

First Embodiment

A first embodiment of a method of manufacturing an EL display apparatus of the present invention, which is implemented as a method of manufacturing an active matrix type color EL display apparatus, will be described with reference to the drawings.

Figure 1:
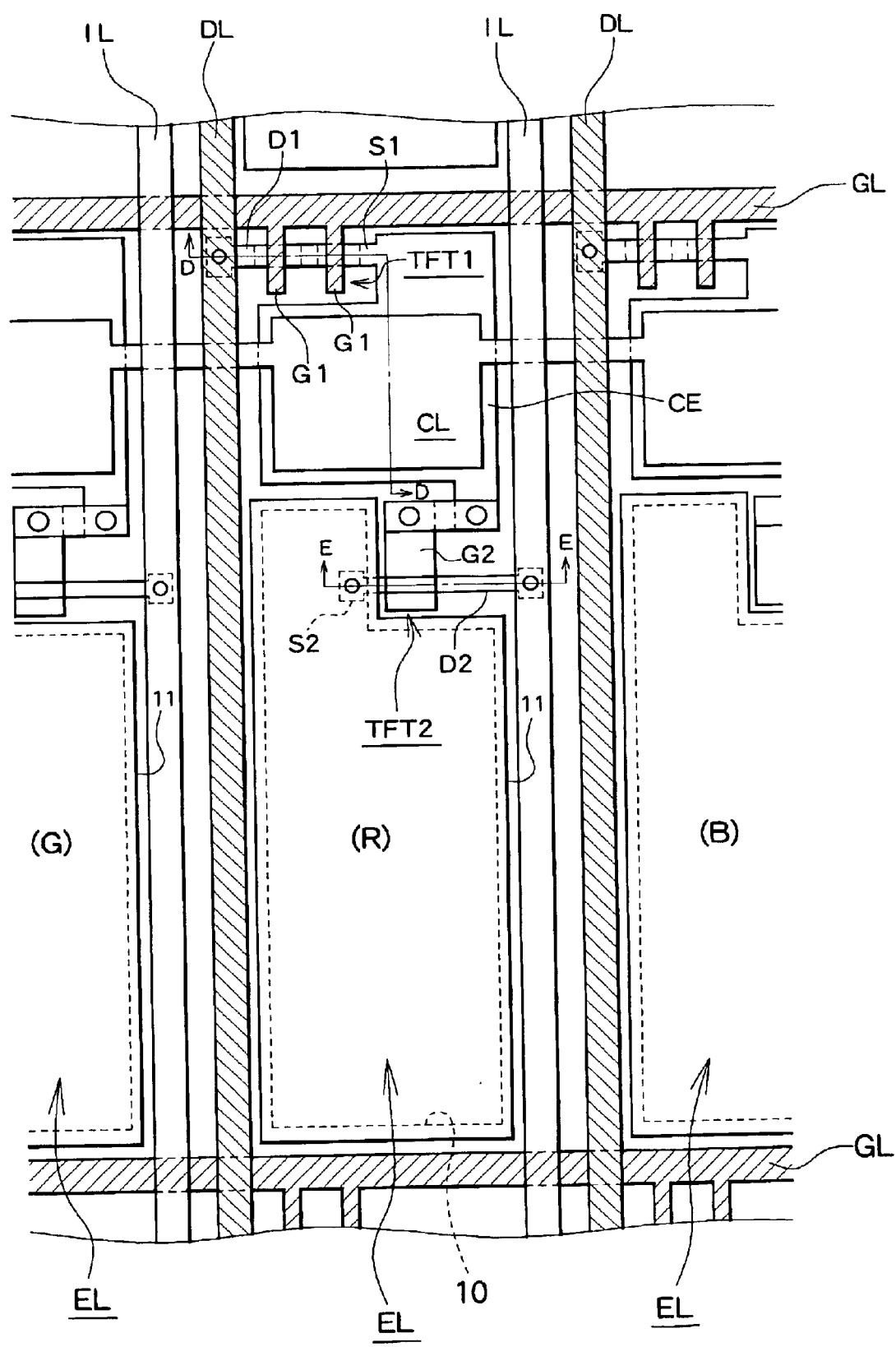
FIG. 1 is a plan view of an active matrix type EL display apparatus as seen from above.

FIG. 1 is a plan view of an EL element (which is an organic EL element in this embodiment and is indicated as "EL" in FIG. 1) and its peripheral section, of an EL display apparatus to be manufactured according to the present embodiment. Referring to FIG. 1, the EL display apparatus comprises a display pixel formed by the EL element, and a thin film transistor (TFT) which is an active element provided for each corresponding display dot.

More specifically, as shown in FIG. 1, gate signal lines GL and drain signal lines (data signal lines) DL are arranged in a matrix as signal lines for performing drive control of the EL element. An EL element (display pixel) is provided corresponding to each intersection of these signal lines. In the EL display apparatus shown in FIG. 1, each display pixel corresponds to any one of the primary colors R, G and B, to thereby enable color image display.

Additional elements are also provided so as to perform drive control of each of the EL elements separately. First, near the above-described intersection of the signal lines, a thin film transistor (TFT1), which is connected with the gate signal line GL and functions as a switching element to be turned ON due to the activity of the gate signal line GL, is formed. A source S1 of this TFT1 serves also as a capacitor electrode CE and a storage capacitor is formed between the capacitor electrode CE and a capacitor line CL made of a refractory metal such as chromium (Cr) and molybdenum (Mo). When the TFT1 is turned ON, an electrical charge in accordance with the voltage of a data signal supplied from the data line DL is accumulated in the storage capacitor.

The capacitor electrode CE is connected to a gate G2 of a thin film transistor (TFT2) which drives the EL element. Further, a source S2 of the TFT2 is connected with a transparent electrode 11 which is an anode of the EL element, while a drain D2 of the TFT2 is connected with a drive power source line IL which is a current source for supplying an electrical current to the EL element. With this structure, a voltage in accordance with the electrical charge stored in the storage capacitor is applied from the capacitor electrode CE to the gate G2, such that a current in accordance with the applied voltage is supplied from the drive power source line IL to the EL element.

Figure 2A:
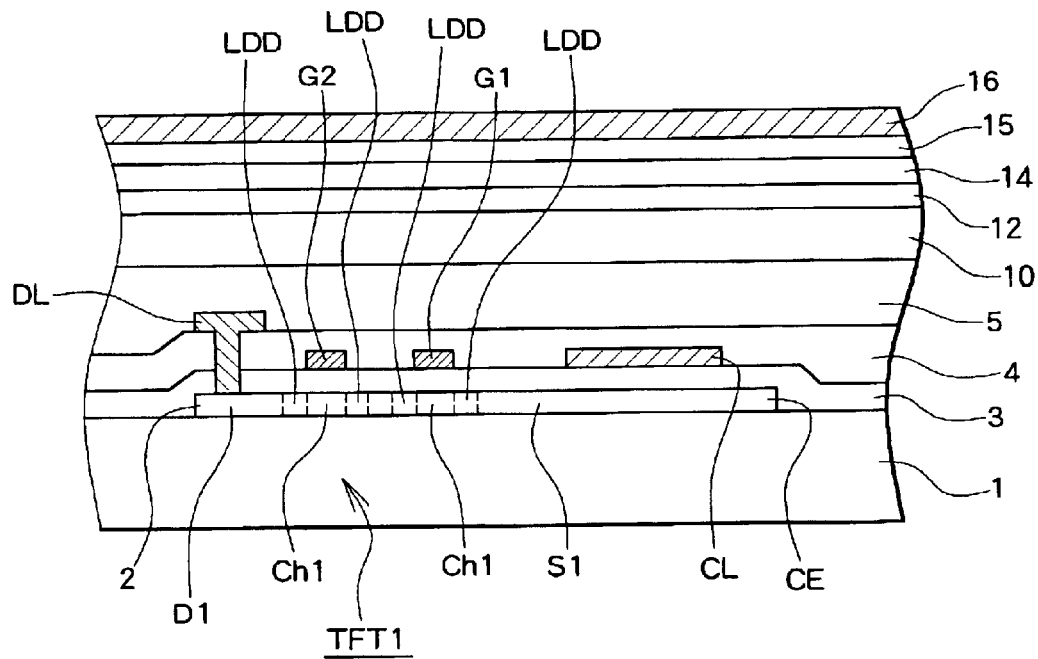
FIGS. 2A and 2B are cross sectional views each showing a partial sectional structure of an active matrix type EL display apparatus.
Figure 2B:
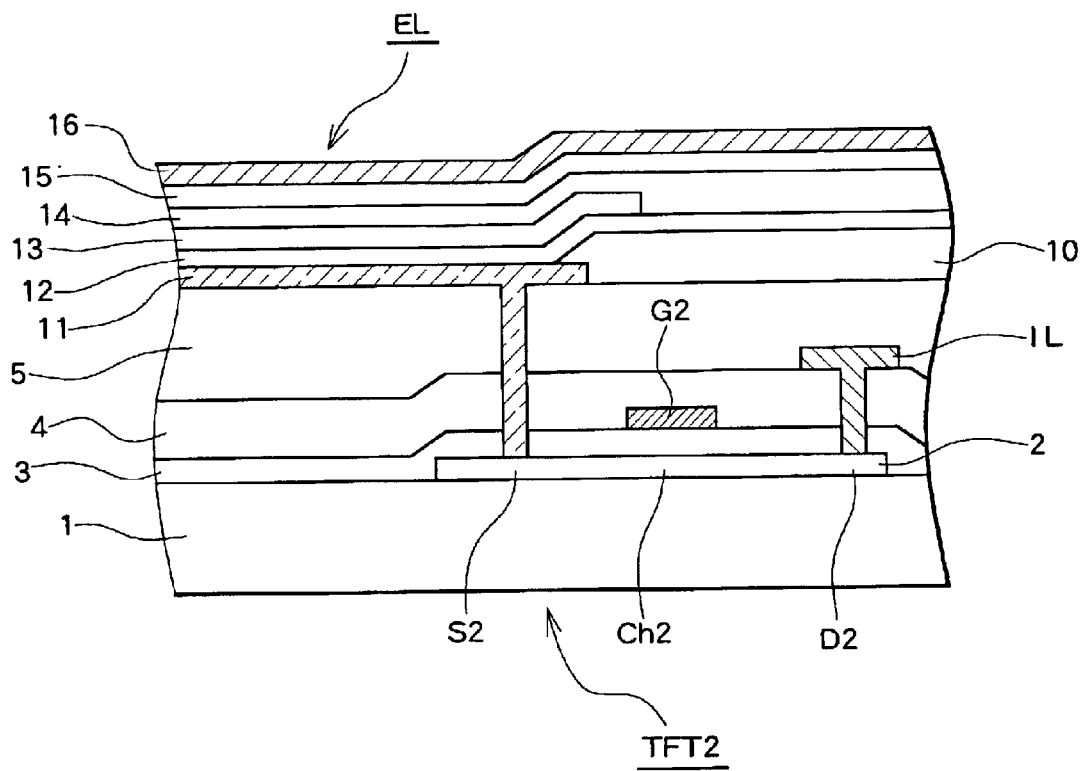

FIGS. 2A and 2B are cross sectional views taken along lines D—D and E—E of FIG. 1, respectively. As shown in FIGS. 2A and 2B, the above-described EL display apparatus is formed by sequentially forming a thin film transistor and an EL element on a glass substrate 1 in a laminated structure.

First, the TFT1 which serves as a switching transistor for performing charging control of the storage capacitor is formed in a manner shown in FIG. 2A. Specifically, on the glass substrate 1, a poly-silicon layer 2 is formed. In this polysilicon layer 2, the above-described source S1 and the drain D1 as well as channels Ch1 are formed, while LDDs (Lightly Doped Drains) are further provided on both outer sides of the channels Ch1. The poly-silicon layer 2 also serves as a storage capacitor electrode CE. On the polysilicon layer 2 and the storage capacitor electrode CE, a gate insulating film 3, the above-described gate signal line GL made of a refractory metal such as Cr and Mo and a gate electrode G1 which is integral with the gate signal line GL, and a storage capacitor electrode line CL are formed. Further, over these layers, an interlayer insulating film 4 formed by accumulating a silicon oxide film and silicon nitride film, in this order, in a laminate structure is provided. This interlayer insulating film 4 has an opening at a position corresponding to the drain D1. By filling this opening with a conductive material such as aluminum, the drain D1 comes into electrical contact with the drain signal line DL. Further, on these drain signal line DL and the interlayer insulating film 4, a planarization insulating film 5 made of, for example, an organic resin, is formed for surface planarization.

On the other hand, the TFT2 for driving the EL element is formed in a manner as shown in FIG. 2B. Specifically, on the glass substrate 1, a poly-silicon layer 2 which is equal to that shown in FIG. 2A is formed. In this poly-silicon layer 2, a channel Ch2, a source S2, and a drain D2 of the TFT2 are formed. On this poly-silicon layer 2, a gate insulating film 3 which is equal to that shown in FIG. 2A is formed, and on the portion of the gate insulating film 3 which is located above the channel Ch2, a gate G2 made of a refractory metal such as chromium (Cr) and molybdenum (Mo) is provided. Over the gate G2 and the gate insulating film 3, an interlayer insulating film 4 and a planarization insulating film 5 which are equal to those shown in FIG. 2A are sequentially formed in a laminate structure. The interlayer insulating film 4 has an opening at a position corresponding to the drain D2, and by filling this opening with an conductive material such as aluminum, the drain D2 comes in electrical contact with the drive power source line IL. Also, a contact hole is formed through portions of the interlayer insulating film 4 and the planarization insulating film 5 which correspond to the source S2. Then, ITO (Indium Tin Oxide) is formed so as to fill this contact hole, so that the source S2 comes in electrical contact with an transparent electrode 11 made of ITO or the like. The transparent electrode 11 constitutes an anode of the EL element. It should be noted that the source S2 is not necessarily brought in direct contact with the ITO, and the source S2 and the ITO may be connected in the following manner, for example. That is, a contact hole is first formed in the interlayer insulating film 4 and the gate insulating film 3, and the hole is filled with a conductive material such as aluminum simultaneously with the formation of the contact (the drain electrode) between the drain D2 and the power source line IL. Then, another contact hole is formed at a corresponding portion of the planarization insulating film 5, which is subsequently formed, and ITO is formed so as to fill this contact hole.

As an example, the EL element may comprise the following layers sequentially accumulated in a laminate structure:

a) a transparent electrode 11;

b) a hole transporting layer 12 made of NBP;

c) an emissive layer 13 for red (R) obtained by doping a dopant of red color (DCJTB) into a host material ($Alq_3$), for green (G) obtained by doping a dopant of green color (Coumarin 6) into a host material ($Alq_3$), or for blue (B) obtained by doping a dopant of blue color (Perylen) into a host material (BAlq);

d) an electron transporting layer 14 made of $Alq_3$;

e) an electron injecting layer 15 made of lithium fluoride (LiF); and f) an electrode (cathode) 16 made of aluminum (Al).

The abbreviations used in the above description refer to the following materials:

"NBP" refers to N,N'-di((naphthalene-1-yl)-N,N'-diphenylbenzidine);

"$Alq_3$" refers to tris(8-hydroxyquinolinato)aluminum;

"DCJTB" refers to (2-(1,1-dimethylethyl)-6-(2-(2,3,6,7-tetrahydro-1,1,7,7-tetramethyl-1H,5H-benzo[ij]quinolizin-9-yl)ethenyl)-4H-pyran-4-ylidene) propanedinitrile;

"Coumarin 6" refers to "3-(2-benzothiazolyl)-7-(diethylamino)coumarin; and

"BAlq" refers to (1,1'-bisphenyl-4-Olato)bis(2-methyl-8-quinolinplate-N1,08)Aluminum.

The hole transporting layer 12, the electron transporting layer 14; the electron injecting layer 15 and the electrode 16 are also formed in the regions shown in FIG. 2A as common layers. However, the emissive layer 13, which is formed in an individual island shape for each pixel so as to correspond to the transparent electrode 11, is not shown in FIG. 2A. It should be noted that, as shown in FIGS. 2A and 2B, an insulating film 10 is formed on the planarization insulating film 5.

An example method of manufacturing an EL display apparatus according to the present embodiment will now be described.

FIG. 3 shows the procedures for manufacturing an EL display apparatus according to the present embodiment. Referring to FIG. 3, this series of procedures starts with step s100 where a TFT and a transparent electrode 11 are formed on a glass substrate 1. Further, the hole transporting layer 12 is formed using vacuum evaporation or the like on substantially all the surface of the substrate 1 (step s101).

The glass substrate 1 on which the hole transporting layer 12 has been formed is then transported into a vacuum chamber which is used, in this example, for forming an emissive layer, without being exposed to the air (step s102). At this time, the substrate 1 is transported with the surface having the hole transporting layer 12 formed thereon facing downward. Inside the chamber, a mask 30 made, for example, of nickel (Ni) and having an opening (not shown) which has been previously formed so as to correspond to the shape of the emissive layer, is provided. Specifically, the mask 30 is fixedly secured to a holding plate 34 having an opening at least in the mask region, by means of a mask frame 31 provided on the holding plate 34.

Figure 4:
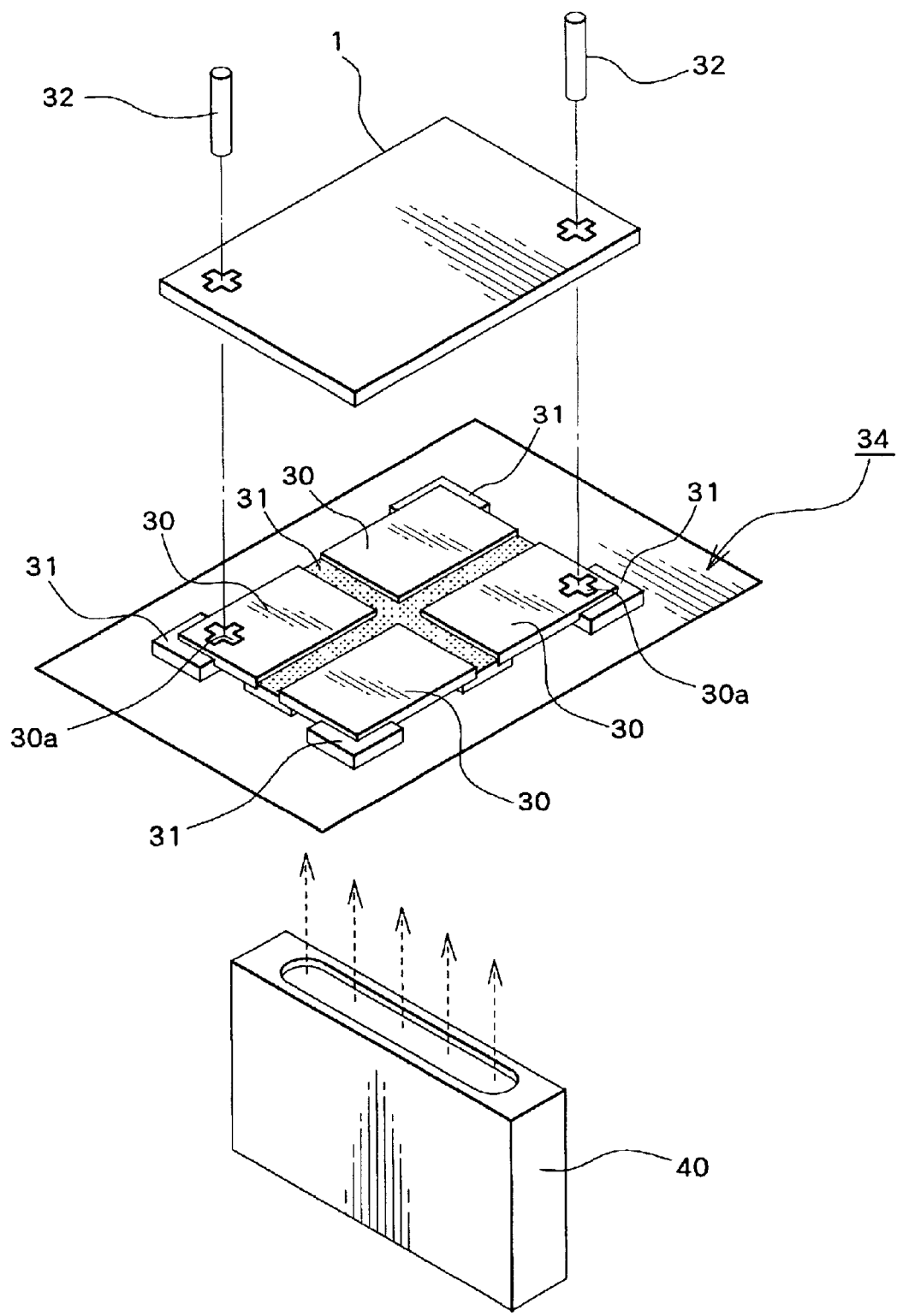
FIG. 4 is a perspective view showing alignment of a mask and a glass substrate in a vacuum chamber in accordance with the first embodiment of the present invention.

Once the glass substrate 1 having the hole transporting layer 12 formed thereon is inserted in the vacuum chamber, the glass substrate 1 and the mask 30 located below the substrate 1 are aligned. Specifically, while the position of an alignment mark 30a formed in the mask 30 and the position of an alignment mark 1a formed on the glass substrate 1 are monitored using a CCD (Charge Coupled Device) camera 32 or the like, the glass substrate 1 and the mask 30 are aligned with each other such that alignment marks 30a and 1a correspond with each other (step s103 in FIG. 3). Although these alignment marks 30a and 1a are shown in FIG. 4 in an enlarged manner for the convenience of drawing, the example marks are actually square crosses having 50 μm bars. Naturally, the shape and the size of the alignment mark is not limited to this example.

Actually, in the above steps, it is necessary to form pixels corresponding to three main colors R, G, and B on a single panel so as to obtain a color display apparatus. Therefore, the emissive layers for R, G, and B are to be formed individually. More specifically, when different emissive materials are used for each of R, G, and B, the glass substrate 1 on which the hole transporting layer 12 has been formed is inserted into each of the individual vacuum chambers in turn, for forming the emissive layer 13 corresponding to each of the primary colors R, G, and B. In each of these vacuum chambers, a mask having an opening at a portion corresponding to the transparent electrode (anode) 11 which is used for light emission of a predetermined primary color is provided as the above-described mask 30. Namely, a mask corresponding to one of the colors R, G, and B is provided in each of the vacuum chambers. It is therefore possible to form an emissive layer corresponding to each of the primary colors at a predetermined position, in each chamber.

Figure 5:
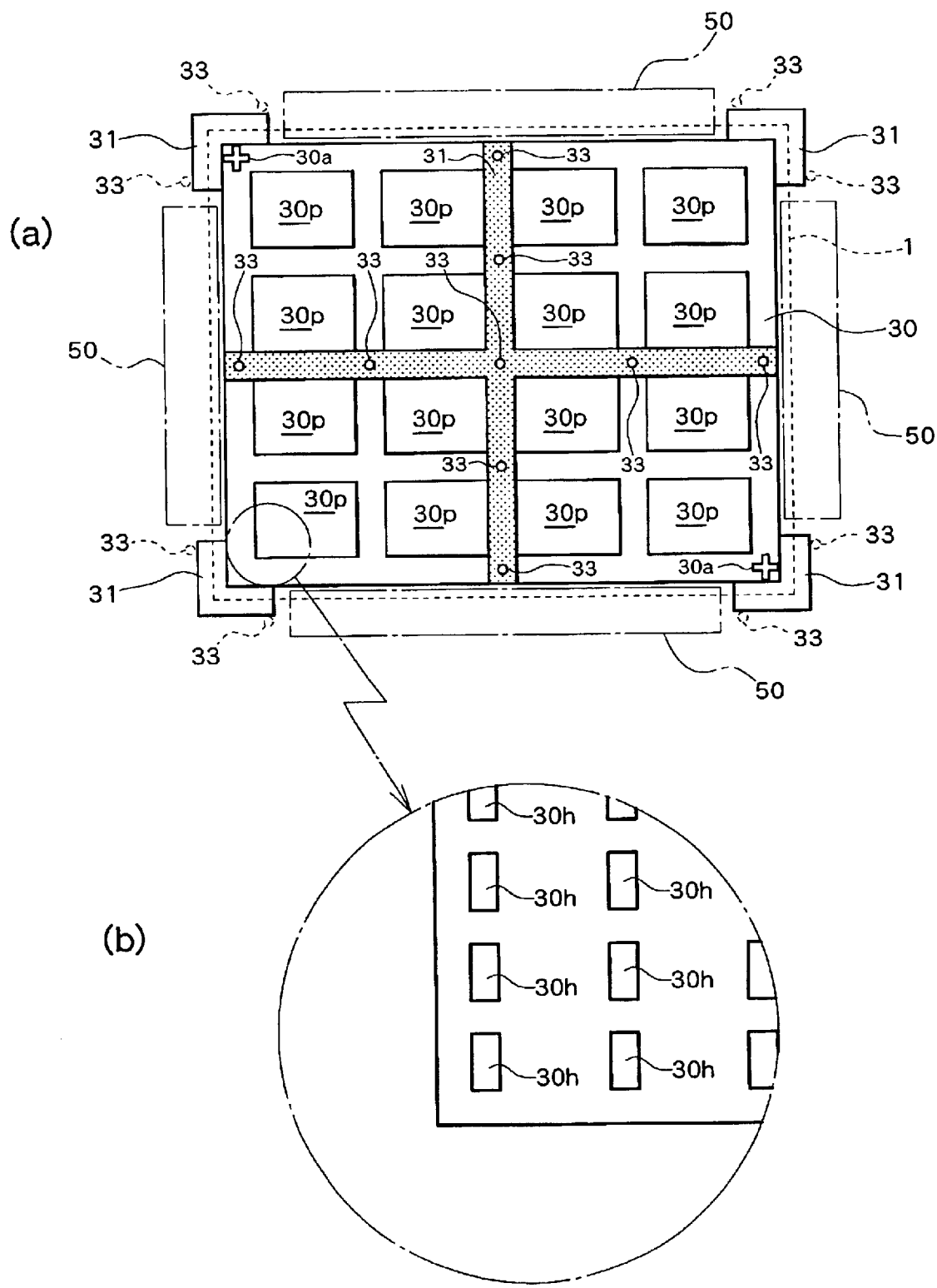
FIG. 5 is a plan view showing disposition of a mask and a glass substrate according to the first embodiment.

FIG. 5(*a*) shows how the glass substrate 1 (indicated by a dot line in this drawing) is aligned with respect to the mask 30. In this embodiment, the mask 30 is constituted so as to form a large number of display panels from a single glass substrate. More specifically, as illustrated in FIG. 5(*a*), the mask 30 according to this embodiment includes 16 panel forming sections 30p so as to form 16 display panels simultaneously. These 16 panel forming sections 30p are formed by 4 masks 30 each having 4 panel forming sections 30p. In each panel forming section 30p, openings 30h are formed in such a manner that each opening 30h corresponds to the transparent electrode 11 used for emission of light of a desired primary color.

When the mask 30 and the glass substrate 1 are aligned with each other as shown in FIG. 5(*a*), the glass substrate 1 is then supported by the mask frame 31 or the like. Then, by heating a material for the emissive layer 13 to evaporate from the evaporation source 40 located below the holding plate 34 as shown in FIG. 4, the material is deposited onto the surface of the glass substrate 1 through the openings of the mask (step s104).

Figure 6:
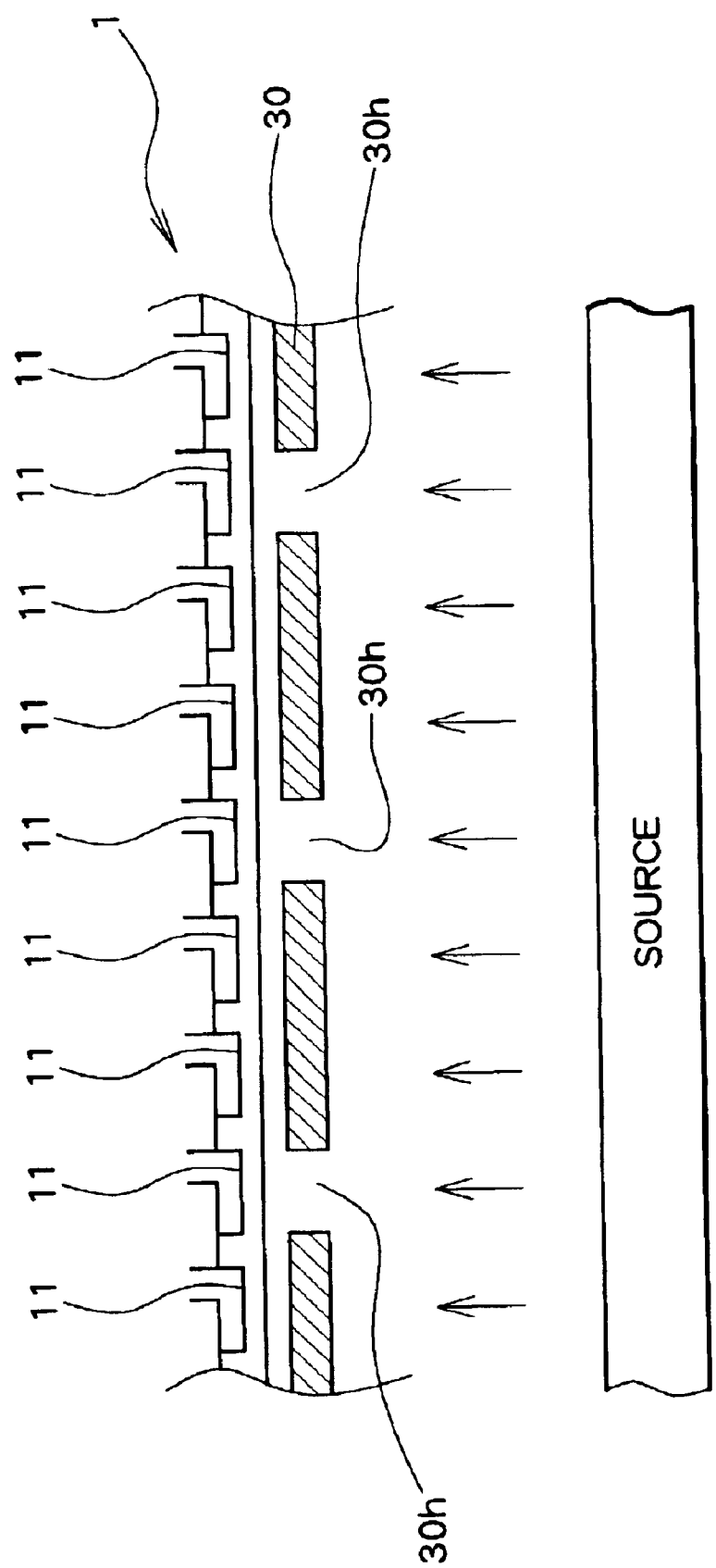
FIG. 6 is a side view schematically showing formation of an EL element by evaporation according to the first embodiment.

The formation of the emissive layer via the mask as described above is schematically shown in FIG. 6. Referring to FIG. 6, of the respective transparent electrodes (anodes) 11, portions other than regions where the transparent electrodes corresponding to a desired primary color for each chamber are formed, are covered with the mask 30. An EL material (an organic EL material) corresponding to the desired primary color is heated within the source, is evaporated, and is then deposited on the glass substrate 1 (to be specific, on the hole transporting layer 12) through the opening 30h of the mask 30.

After the emissive layer of the corresponding primary color is thus formed by evaporation within each chamber, the glass substrate 1 is removed from the vacuum chamber used for forming the emissive layer, and then transported into another vacuum chamber where the electron transporting layer 14, the electron injecting layer 15, and the electrode (cathode) 16 are formed (step s105 in FIG. 5). It should be noted that formation of the electron transporting layer 14, the electron injecting layer 15 and the electrode (cathode) 16 are carried out in separate chambers.

As described above, there is a problem that flexure is generated in the glass substrate 1 and the mask 30 when the glass substrate 1 and the mask 30 are aligned with each other within the vacuum chamber in a manner as described above. In particular, when a large size glass substrate 1 is used so as to form a plurality of display panels simultaneously as in the present embodiment, significant flexure is likely to be generated in the glass substrate 1.

The relationship between the size and support type of the glass substrate and the flexure generated in the glass substrate will be described with reference to FIGS. 7A–7C.

Figure 7A:
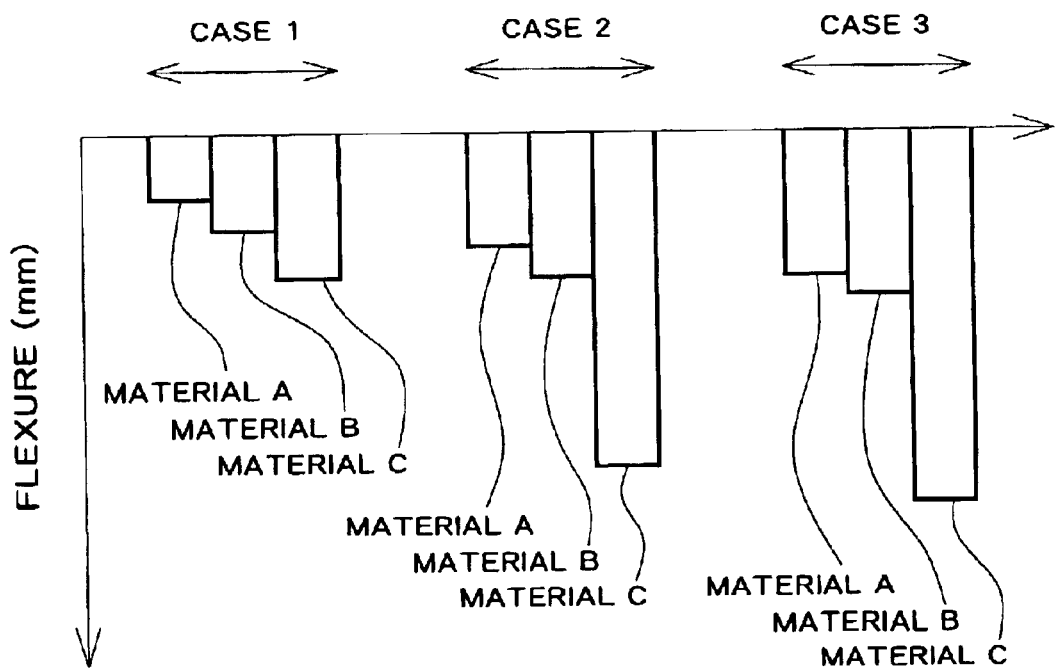
FIGS. 7A, 7B, and 7C are diagrams for explaining the relationship between the size and support type of a glass substrate and the flexure generated in the glass substrate.

FIG. 7A shows a relationship between the size and support type of a glass substrate and the flexure generated in the glass substrate. Referring to FIG. 7A, the case 1 indicates the amount of flexure of a glass substrate having a length K and made of one of different materials A, B, and C when the substrate is supported in a manner shown in FIG. 7B. The case 2 indicates the amount of flexure of a glass substrate having a length L (L>K) and made of one of different materials A, B, and C when the substrate is supported in a manner shown in FIG. 7B. The case 3 indicates the amount of flexure of a glass substrate having a length K and made of one of different materials A, B, and C when the substrate is supported in a manner shown in FIG. 7C.

Figures 7B, 7C:
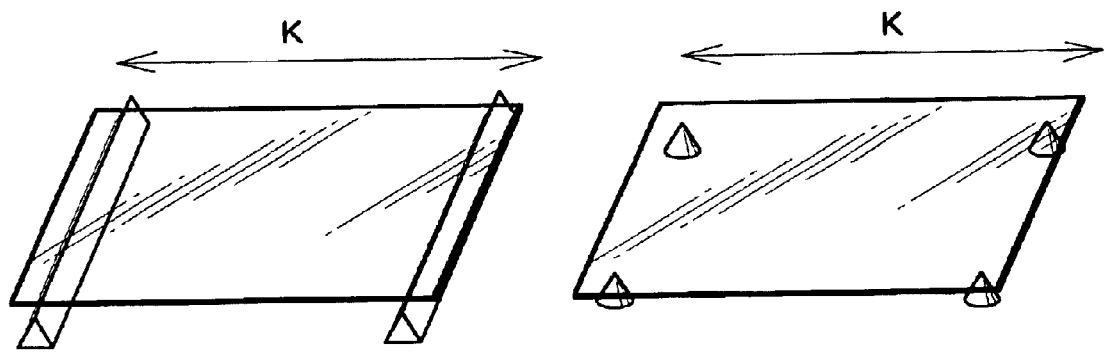

As is obvious from FIG. 7A, compared to when the glass substrate is point supported (FIG. 7C), flexure can be reduced to a greater extent when the glass substrate is supported along its sides (FIG. 7B). It can also be seen from FIG. 7A that the shorter the glass substrate, the less flexure will be produced. When the gravitational acceleration is g, the Poisson ratio is a, the density of the glass is p, the Young's modulus of the glass is E, and the thickness of the glass is t, the flexure n generated when a glass substrate is supported in a manner shown in FIG. 7B can be expressed by the following equation (c1):

$$n = K^4 g \, \rho(1-\sigma^2)/6.4 \, Et^2 \quad (c1)$$

As can be seen from the above equation (c1), as the length of the glass substrate increases, the amount of flexure will drastically increase.

Figure 8:
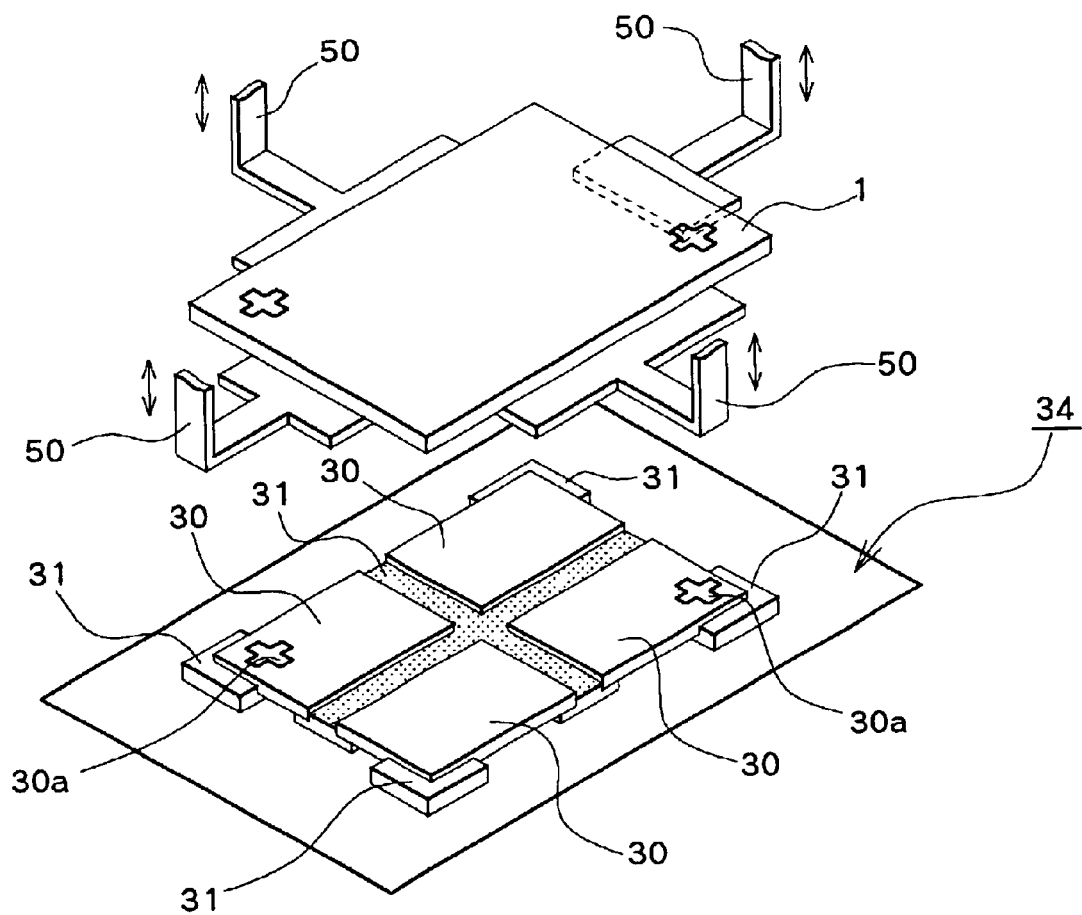
FIG. 8 is a perspective view showing support of a glass substrate according to the first embodiment.

Therefore, according to the present embodiment, four sides of the glass substrate 1 are supported by means of side supporting members 50 in a manner shown in FIG. 8, so as to inhibit the flexure generated in the glass substrate 1. Specifically, because the longer the unsupported side of the glass substrate, the greater the flexure of the glass substrate, increased flexure resulting from increase in the length of the glass substrate 1 is suppressed by supporting the four sides of the glass substrate 1.

Further, the four sides of the glass substrate 1 are supported by the side supporting members 50 such that the side supporting members 50 which face each other and support each pair of opposing sides of the glass substrate 1 are disposed as symmetrically as possible, thereby further inhibiting the generation of flexure in the glass substrate 1. More specifically, a pair of side supporting members 50 supporting the opposing sides of the glass substrate 1 are designed to be the same size and of symmetrical shape to the greatest possible extent. Also, all the supporting members 50 are coordinated such that the levels of their supporting surfaces are aligned. The operation of the four supporting members 50 can be controlled individually or, for example, for each pair of opposing members 50. Further, when the glass substrate 1 and the mask 30 are aligned with each other, it is preferable that the plurality of supporting members 50 be adjusted to prevent their relative positions from being misaligned.

Also, according to the present embodiment, each of the supporting members 50 supports an edge side of a surface of the glass substrate 1 which faces the mask 30. By supporting the glass substrate 1 by the side supporting members 50 along each side in a line supporting manner, it is possible to support the glass substrate 1 without the side supporting members 50 contacting the display region of the glass substrate 1.

More specifically, as shown in FIG. 8, each of the side supporting members 50 has an L shape. The glass substrate 1 is supported by the side supporting members 50, with the element forming surface of the glass substrate 1, in this example, a surface on which the hole transporting layer 12 has been formed, facing downward and setting on the end portion of the L shaped members 50.

The length of each side supporting member 50 is designed to be shorter than each side of the glass substrate 1. More specifically, the length of the portion of the side supporting member 50 on which the glass substrate 1 is disposed is made shorter than the interval between two adjacent mask frames 31 of the mask frames 31 provided corresponding to the periphery of the glass substrate 1. It is thereby possible to prevent interference between the mask frames 31 and the side supporting members 50, as shown in FIG. 5. After the alignment between the glass substrate 1 and the mask 30 is completed, the side supporting members 50 are removed. By setting the length of the side supporting members 50 as described above, the glass substrate 1 can be supported by the side supporting members 50 at positions indicated in FIG. 5(a) by one dotted chain line. It is also possible to remove the side supporting members 50 in a simple manner without making the supporting members 50 contact with the mask frames 31, by, for example, withdrawing each supporting member 50 in the direction parallel to the lower surface of the glass substrate 1 and away from the substrate 1.

With the present embodiment described above, the following advantage can be achieved.

(1) Because the glass substrate 1 and the mask 30 are aligned with each other while the four sides of the glass substrate 1 is being supported by the side supporting members 50, it is possible to suppress the flexure generated in the glass substrate 1 more suitably and to prevent the evaporation surface of the glass substrate 1 from being damaged by the mask 30.

Alternatively, it is also possible in the foregoing embodiment to perform deposition of the EL material onto the glass substrate 1 with the glass substrate 1 being supported by the side supporting members 50. In this case, a mask frame 31 having an arbitrary shape can be used.

Second Embodiment

A second embodiment of a method of manufacturing an EL display apparatus of the present invention, which is implemented as a method of manufacturing an active matrix type color EL display apparatus, will be described mainly with regard to the difference from the above-described first embodiment, and with reference to the drawings.

In this second embodiment, at the time of alignment of the glass substrate 1 and the mask 30, a supporting method for a substrate as will be described below is also used.

Figure 9:
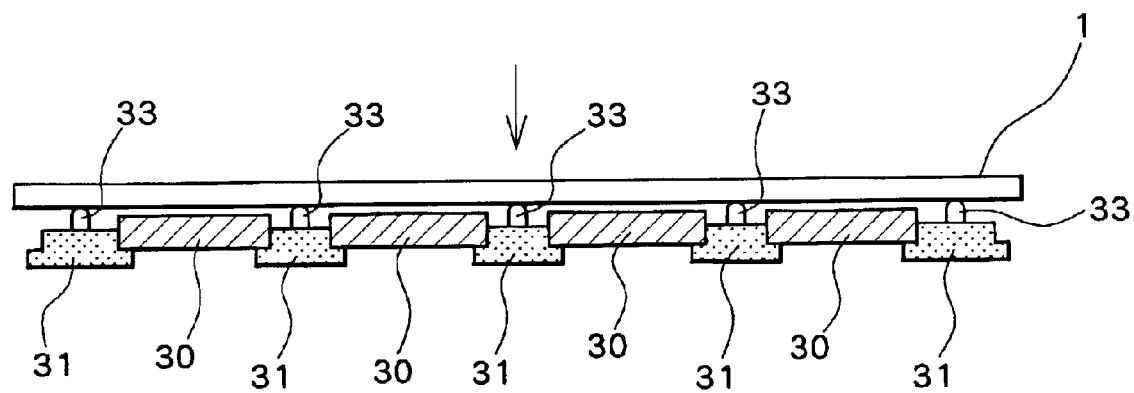
FIG. 9 is a cross sectional view showing support of a glass substrate according to a second embodiment of a method of manufacturing an EL display apparatus of the present invention.

More specifically, as shown in FIG. 5(a), a plurality of pins 33 made of a resin, a metal, or the like are provided on the mask frame 31. The contact surface of the pin 33 which abuts the glass substrate 1 is spherical, as shown in FIG. 9. When the glass substrate 1 and the mask 30 are aligned with each other, the glass substrate is supported by these spherical contact surfaces, especially in the center region of the glass substrate 1. This makes it possible to reduce the flexure without damaging the glass substrate 1 at the time of alignment.

In particular, these pins 33 are arranged such that they can support at least portions of the glass substrate 1 which are not supported by the side supporting members 50, such as the center region of the glass substrate 1. Also, the pins 33 are arranged symmetrically with regard to the surface of the glass substrate 1. Obviously, these pins 33 are not unevenly distributed or provided only at one part of the glass substrate 1, but are evenly distributed at equal intervals over the whole surface of the substrate, except in the display region. In the layout of FIG. 5, for example, the pins 33 are arranged in a cross form in the region other than the panel region and are disposed in such a manner that they divide each side of the glass substrate 1 into equal parts and that each pin 33 is located at the midpoint between two adjacent panel forming sections 30p.

Further, in this embodiment, the pin 33 is made capable of expansion and contraction by, for example, including a spring, such as a a flat spring, at the lower portion. Therefore, the pin 33 can be contracted due to the weight of the glass substrate 1 to thereby appropriately support the glass substrate 1. Further, the pin 33 is designed to be contractable to the level of the mask frame 31, so that, after completion of the alignment, the pin 33 can be contracted to a level substantially equal to that of the upper surface of the mask 30 due to the weight of the glass substrate 1 or an external force. In addition, when the pin 33 is designed such that the height of the pin 33, even when contracted, is higher than the level of the mask 30, it is possible to maintain a gap between the mask 30 and the glass substrate 1, to thereby more reliably prevent the glass substrate 1 from being damaged by the mask 30.

According to the second embodiment as described above, the following advantages can be achieved in addition to the above-described advantage (1) of the first embodiment.

(2) By performing the alignment of the glass substrate 1 and the mask 30 while the glass substrate 1 is being supported by the pins 33, it is possible to more reliably or to a greater extent prevent the generation of flexure in the glass substrate 1.

(3) Because the pin 33 is designed such that it is capable of expansion and contraction in the perpendicular direction, after the glass substrate 1 and the mask 30 are aligned, it is possible to smoothly support the glass substrate 1 by the mask 30 or the like, and also to maintain a gap between the mask 30 and the glass substrate 1.

In this second embodiment, the arrangement of the pins 33 is not limited to the above-described example, and the pins 33 can be arranged in any other manner as long as the pins 33 can support the glass substrate 1 in the region other than the display region. Alternatively, it is also possible to provide the pins 33 on the holding plate 34 of the mask frame 31 rather than on the mask frame 31, as shown in FIG. 5(a) by a dotted line.

The features of the pin 33 are not limited to the capability of expansion and contraction as described. When the pin 33 is not capable of expansion and contraction, the alignment and the evaporation of the EL material may, for example, be performed with the glass substrate 1 being supported by these pins 33.

Third Embodiment

A third embodiment of a method of manufacturing an EL display apparatus of the present invention, which is implemented as a method of manufacturing an active matrix type color EL display apparatus, will be described mainly with regard to differences from the above-described second embodiment, and with reference to the drawings.

In the third embodiment, during alignment of the glass substrate 1 and the mask 30 according to the second embodiment, a supporting method for a substrate as will be described below is simultaneously implemented.

More specifically, in this embodiment, at the time of alignment of the glass substrate 1 and the mask 30, the upper surface of the glass substrate 1 is supported using electrostatic adsorption. Namely, within a vacuum chamber, it is not possible to support the upper surface of the glass substrate 1 by, for example, suction using a pressure lower than the air. Accordingly, by supporting the upper surface of the glass substrate 1 by electrostatic adsorption, supporting of the glass substrate 1 by adsorption can be achieved even in the vacuum chamber.

Figure 10:
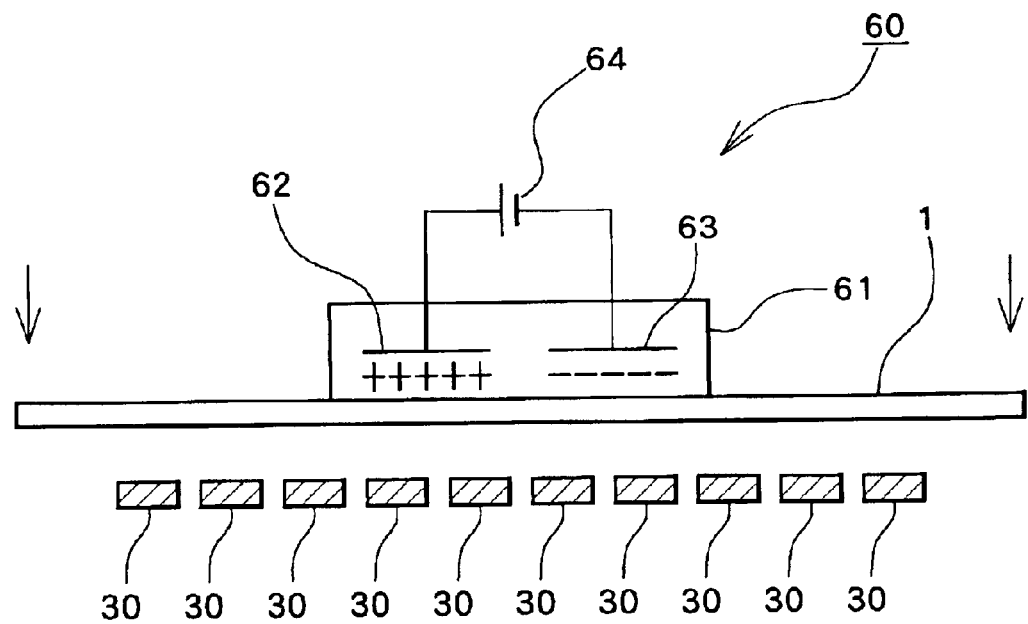
FIG. 10 is a cross sectional view schematically showing support of a glass substrate according to a third embodiment of a method of manufacturing an EL display apparatus of the present invention.

FIG. 10 shows the principle of the electrostatic adsorption. Referring to FIG. 10, an electrostatic adsorption device 60 used in this embodiment comprises a pair of electrodes 62, 63 provided in the adsorption section 61 made of ceramic or the like and a battery 64 whose anode and cathode are connected to the pair of electrodes 62, 63, respectively. By supporting the glass substrate 1 by means of adsorption using the electrostatic adsorption device 60, it is possible to further reduce the flexure generated in the glass substrate 1.

Figure 11:
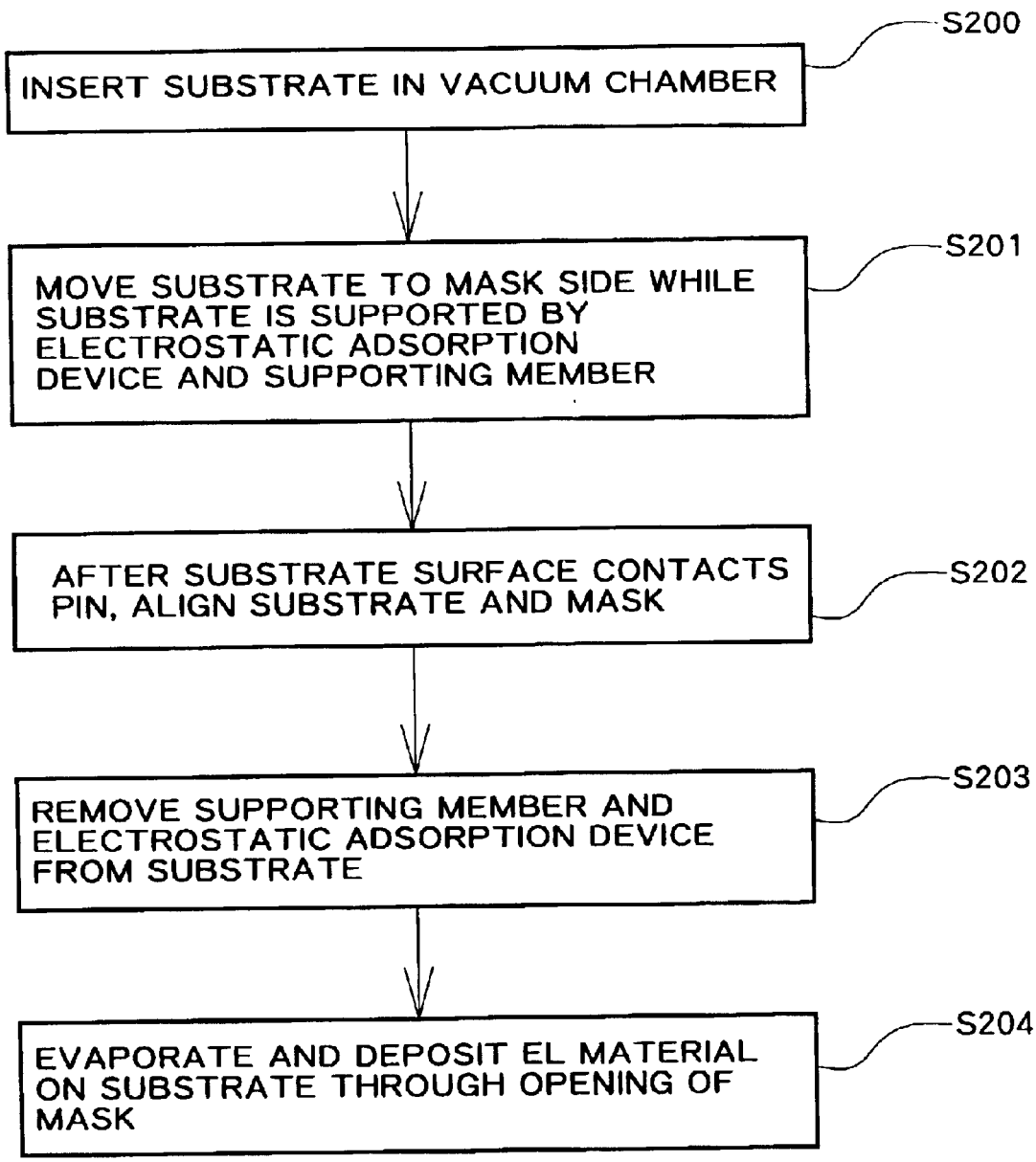
FIG. 11 is a flowchart showing the procedures for formation of an EL element by evaporation according to the third embodiment.

Referring to FIG. 11, the procedure for alignment between the glass substrate 1 and the mask 30 according to the present embodiment will be summarized.

In this procedure, when the glass substrate 1 is inserted into a vacuum chamber (step s200), the glass substrate 1 is moved toward the mask 30 side with the glass substrate 1 being supported by the electrostatic adsorption device 60 and the supporting members 50 (step s201). Then, after the glass substrate 1 comes into contact with the pins 33, the glass substrate 1 is aligned with the mask 30 (step s202). When the alignment is complete, the glass substrate 1, which is at this point supported by the electrostatic adsorption device 60 and the supporting members 50, is lowered. Then, with the glass substrate being supported by the mask 30 or the pins 33, the electrostatic adsorption device 60 and the supporting members 50 are removed (step s203). The EL material is then deposited to the glass substrate 1 which has been thus aligned with the mask 30 (step s204).

According to the third embodiment described above, the following advantage can be further achieved in addition to the above advantage (1) of the first embodiment and the advantages (2) and (3) of the second embodiment.

(4) Because the upper surface of the glass substrate 1 is supported by electrostatic adsorption, it is possible, at the time of alignment between the glass substrate 1 and the mask 30, to still further suppress the generation of flexure in the glass substrate 1 and accordingly to appropriately align the glass substrate 1 with the mask 30.

Alternatively, the third embodiment may be implemented in the following manner.

Specifically, although in the above-described third embodiment, the electrostatic adsorption is further used simultaneously at the time of the alignment between the glass substrate 1 and the mask 30 according to the second embodiment, the electrostatic adsorption can be used simultaneously at the time of the alignment between the glass substrate 1 and the mask 30 according to the first embodiment.

Other Embodiments

The following variations may be employed with any of the above-described embodiments.

The mask arrangement for providing a plurality of display panels is not limited to the example shown in FIG. 5 in which a mask is divided into four parts. When the mask is changed, the mask frame may be appropriately changed as necessary into a suitable shape capable of fixing the mask.

A plurality of display panels need not necessarily be formed simultaneously.

Figure 12:
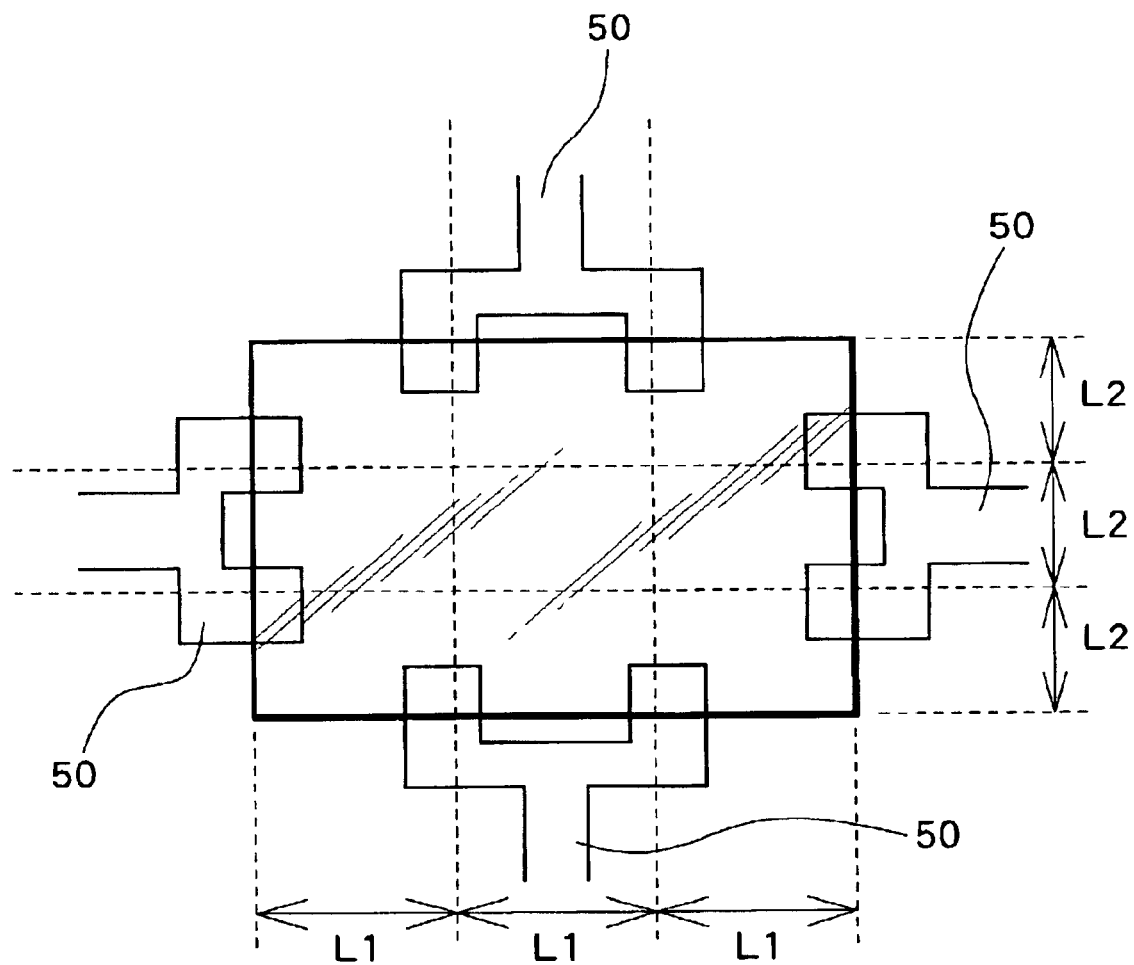
FIG. 12 is a plan view showing support of a glass substrate as a modification example of the above embodiments.

Further, supporting members other than the side supporting members 50 may also be used for supporting the four sides of the glass substrate 1. For example, as shown in FIG. 12, a supporting member which supports two trisecting points on each side of the glass substrate, which is trisected at equal intervals, may be used. With this structure, it is similarly possible to support four sides of a glass substrate to thereby reduce the flexure when the length of a side is increased. Any method of supporting four sides other than that shown in FIG. 12 may be also used. In all cases, however, it is preferable that the support portions are symmetrical.

It is also possible to support at lease three sides of a glass substrate rather than all four sides.

Further, the structure of the mask frame 31 is also not limited to the example shown in FIG. 5(a), and any other form of mask frame 31 may be used as long as the mask frame 31 can simultaneously fix the mask 30 and eliminate interference with the supporting members 50 or the like.

The present invention is not limited to use with a vacuum evaporation process, and is effective for reducing the flexure generated in the glass substrate when alignment is performed between an EL element forming substrate such as a glass substrate and a mask.

The layer of an EL element which is formed for each R, G, and B region using a mask is not limited to an emissive layer. For example, when it is desired to vary the deposition amount for forming a hole transporting layer or an electron transporting layer among R, G and B, it is effective to form these layers via a mask as in the formation of the emissive layer according to each of the above-described embodiments. Accordingly, the present invention can also be effectively applied to the alignment between the substrate and the mask in such a case.

The present invention is not limited to use for an active matrix type EL display apparatus, but is effective for manufacturing an EL display apparatus of any type such as a passive matrix type.

In addition, the EL element material is not limited to the examples described in the above-described embodiments, but any material which can be implemented as an EL display apparatus may be used. Further, the materials for the mask or the like are also not limited to the examples described in the above-described embodiments.

Figure 13:
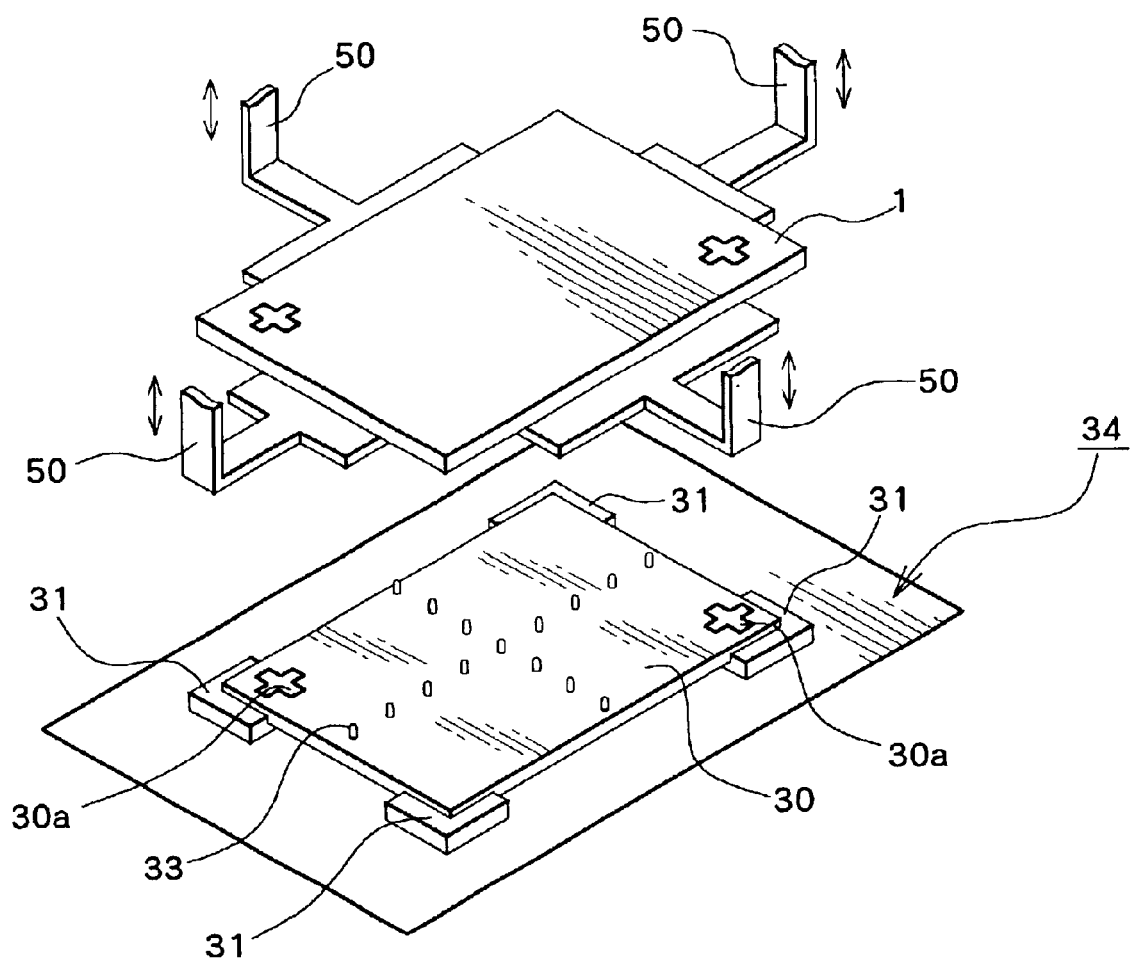
FIG. 13 is a view showing an example in which a glass substrate is supported in another manner in each of the above embodiments.

In the preceding description, as shown in FIGS. 4 and 5(a) or the like, a plurality of masks 30 are fitted in and positioned on the mask frames 31, so that these masks 30 can be used as an evaporation mask for a single large-size glass substrate. Alternatively, it is also possible to use a single mask 30 for a single glass substrate, as shown in FIG. 13. The mask 30 is fit into the mask frames 31 disposed corresponding to four corners of the mask 30, and is thereby positioned on the mask frames 31. Within an evaporation chamber, the glass substrate 1 is disposed above the mask 30 thus positioned. The glass substrate 1 is then aligned with the mask 30 using the alignment mark formed on the glass substrate 1 and the alignment mark on the mask 30, while at least three sides (four sides, in FIG. 13) of the glass substrate 1 are being supported by the side supporting members 50. It should be noted that, in the example shown in FIG. 5(a), the pins 33 for supporting the glass substrate 1 at the time of alignment between the substrate and the mask and of vacuum evaporation, are formed on the mask frame 31. In the example shown in FIG. 13 in which a single mask 30 is used, no mask frames 31 are located in the center portion of the mask 30 (even if the mask frames 31 are located in the center portion of the mask 30, such mask frames 31 do not appear on the surface (the upper surface) of the mask 30 opposing to the glass substrate 1). Accordingly, in such a case, the pins 33 are formed on the mask 30 at the non-opening sections, namely at the non-display region other than the openings 30h as shown in FIG. 5(b).

While the preferred embodiments of the present invention have been described using specific terms, such description is for illustrative purposes only, and it is to be understood that changes and variations may be made without departing from the spirit or scope of the appended claims.

What is claimed is:

1. A method of manufacturing an electroluminescence display apparatus, in which
    after a substrate and a mask disposed below the substrate are aligned, a material of an electroluminescence element is adhered to the substrate through an opening of the mask to form an electroluminescence element layer,
    at least three sides of the substrate are supported by side supporting members while the substrate is aligned with the mask; and
    a side portion of a surface of the substrate opposing the mask is disposed on a contact and support portion of the side supporting member.

2. A method of manufacturing an electroluminescence display apparatus according to claim 1, wherein
    of the side supporting members, a pair of the side supporting members which support opposing sides of the substrate are symmetrical with respect with each other, at least with respect to a contact and support portion which contacts and supports the substrate.

3. A method of manufacturing an electroluminescence display apparatus according to claim 1, wherein
    of the side supporting members, a pair of the side supporting members which support opposing sides of the substrate are symmetrical with respect to each other, at least with respect to a contact and support portion which contacts and supports the substrate, and
    a side portion of a surface of the substrate opposing the mask is disposed on the contact and support portion of the side supporting member.

4. A method of manufacturing an electroluminescence display apparatus according to claim 1, wherein
    the mask is fixed and positioned with respect to a mask frame, and
    the mask and the substrate are aligned with each other, with the substrate being supported by the side supporting members and a plurality of pins provided on the mask or on the mask frame.

5. A method of manufacturing an electroluminescence display apparatus according to claim 4, wherein
    after the mask and the substrate are aligned with each other, the side supporting members are withdrawn.

6. A method of manufacturing an electroluminescence display apparatus according to claim 1, wherein
    at least the alignment between the substrate and the mask is performed within a vacuum chamber.

7. A method of manufacturing an electroluminescence display apparatus according to claim 6, wherein said vacuum chamber is an evaporation chamber for the electroluminescence element layer.

8. A method of manufacturing an electroluminescence display apparatus according to claim 1, wherein
the alignment between the mask and the substrate is performed while the substrate is being supported by the side supporting members and an electrostatic adsorption member for adsorbing an upper surface of the substrate by means of electrostatic force.

9. A method of manufacturing an electroluminescence display apparatus according to claim 8, wherein
at least the alignment between the substrate and the mask is performed within a vacuum chamber.

10. A method of manufacturing an electroluminescence display apparatus according to claim 9, wherein
said vacuum chamber is an evaporation chamber for the electroluminescence element layer.

11. A method of manufacturing an electroluminescence display apparatus in which
after a substrate and a mask disposed below the substrate are aligned, a material of an electroluminescence element is adhered to the substrate through an opening of the mask to form an electroluminescence element layer,
at least three sides of the substrate are supported by side supporting members while the substrate is aligned with the masks, wherein
the mask is fixed and positioned with respect to mask frames which are arranged at intervals, each interval being larger than the length of a portion of the substrate in the side direction which is supported by a contact and support portion of the side supporting member, and
after the mask and the substrate which is supported by the side supporting members are aligned with each other, the side supporting members are withdrawn from positions on the substrate where the side supporting members support the substrate, through the intervals of the mask frames.

12. A method of manufacturing an electroluminescence display apparatus in which
after a substrate and a mask disposed below the substrate are aligned, a material of an electroluminescence element is adhered to the substrate through an opening of the mask to form an electroluminescence element layer,
at least three sides of the substrate are supported by side supporting members while the substrate is aligned with the mask, wherein
the mask is fixed and positioned with respect to a mask frame,
after the mask and the substrate which is supported by the side supporting members are aligned with each other, the side supporting members are withdrawn, and
subsequently, an electroluminescence element layer is formed on a lower surface of the substrate, while the substrate is supported on at least one of the mask and the mask frame.

13. A method of manufacturing an electroluminescence display apparatus according to claim 12,
wherein the mask or the mask frame comprises a plurality of pins for supporting the substrate thereon.

14. A method of manufacturing an electroluminescence display apparatus according to claim 12, wherein the mask frame is disposed on a holding plate.

15. A method of manufacturing an electroluminescence display apparatus according to claim 14, wherein the holding plate comprises a plurality of pins for supporting the substrate thereon.

* * * * *